(12) United States Patent
Dalton et al.

(10) Patent No.: US 7,279,417 B1
(45) Date of Patent: Oct. 9, 2007

(54) USE OF METALLOCENES TO INHIBIT COPPER OXIDATION DURING SEMICONDUCTOR PROCESSING

(75) Inventors: Jeremie Dalton, San Jose, CA (US); Sanjay Gopinath, Fremont, CA (US); Jason M. Blackburn, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 172 days.

(21) Appl. No.: 10/772,109

(22) Filed: Feb. 3, 2004

(51) Int. Cl.
*H01L 21/44* (2006.01)

(52) U.S. Cl. ............... 438/656; 438/597; 257/E21.045; 257/E21.295

(58) Field of Classification Search ............... 438/687, 438/597, 656; 257/E21.045, E21.295
See application file for complete search history.

(56) References Cited

U.S. PATENT DOCUMENTS

| | | | | |
|---|---|---|---|---|
| 4,927,670 A | * | 5/1990 | Erbil | 505/447 |
| 4,935,383 A | * | 6/1990 | Nouhi et al. | 117/104 |
| 4,940,596 A | * | 7/1990 | Wright | 427/598 |
| 5,288,377 A | * | 2/1994 | Johnson et al. | 204/486 |
| 5,336,558 A | * | 8/1994 | Debe | 428/323 |
| 5,424,246 A | * | 6/1995 | Matsuo et al. | 438/642 |
| 5,561,082 A | * | 10/1996 | Matsuo et al. | 438/396 |
| 6,063,705 A | | 5/2000 | Vaartstra | 438/681 |
| 2005/0085031 A1 | * | 4/2005 | Lopatin et al. | 438/222 |

OTHER PUBLICATIONS

U.S. Office Action mailed Oct. 13, 2005, from U.S. Appl. No. 10/868,384 [NOVLP095/NVLS-2911].
U.S. Office Action mailed May 3, 2006, from U.S. Appl. No. 10/868,384 [NOVLP095/NVLS-2911].
U.S. Office Action mailed Aug. 24, 2006, from U.S. Appl. No. 10/868,384 [NOVLP095/NVLS-2911].

\* cited by examiner

*Primary Examiner*—Fernando L. Toledo
*Assistant Examiner*—Jarrett J Stark
(74) *Attorney, Agent, or Firm*—Beyer Weaver LLP

(57) ABSTRACT

Methods for protecting an exposed copper surface of a partially fabricated IC from oxidation during exposure to an oxygen-containing environment are disclosed. The methods involve treating the exposed copper surface with a metallocene compound in order to minimize formation of copper oxide on the exposed surface, and exposing the copper surface to an oxygen-containing environment.

23 Claims, 3 Drawing Sheets

USE OF METALLOCENES TO INHIBIT COPPER OXIDATION DURING SEMICONDUCTOR PROCESSING

FIELD OF THE INVENTION

This invention relates to methods for the passivation of copper in order to prevent the formation of copper oxide. More specifically, the methods involve treating a partially fabricated integrated circuit ("IC") that has copper surface features with ruthenocene or other metallocene in order to prevent copper oxidation during subsequent semiconductor fabrication steps involving oxidizing chemistries.

BACKGROUND

In the field of damascene processing, any amount of copper oxide formed on an exposed copper surface before subsequent deposition of additional copper or a copper diffusion barrier layer is a problem. This is because copper oxide has a low conductivity, and thereby increases the resistance of copper lines formed during fabrication. Furthermore, copper oxide presents integration difficulties and provides failure opportunities during normal use, particularly when high current densities are present.

Nearly all metals, including copper, form a thin oxide layer upon exposure to air and ambient temperatures. Under these conditions, copper forms an oxide layer of approximately 10 to 20 Å thickness. At higher temperatures, oxidation will continue to occur due to oxygen diffusion through the oxide. The following equation approximately describes the thickness, in nanometers, of $Cu_2O$ formed on a Cu surface in oxygen:

$$Cu_2O(nm) = A \times t^{\frac{1}{2}} e^{\frac{-E}{kT}}$$

where $$E = 0.41 \text{ eV}, \quad A = \sqrt{\left(\frac{P}{1 \text{ Torr}}\right)} \times \left(4 \times 10^5 \frac{nm}{\sqrt{min}}\right),$$

t=time in minutes and P=oxygen pressure in Torr.

Because of oxide formation, many IC fabrication processes that involve oxidizing environments cannot be employed. Any time that a process might oxidize an exposed copper surface, significant difficulties result, mostly because of the aforementioned decrease in conductivity. Barrier materials, for example, are typically deposited by using thermal deposition, physical vapor deposition, and chemical vapor deposition in a reducing or oxidizing environment. Thus, barrier materials cannot be deposited on copper using CVD in oxidizing conditions in modern IC fabrication processes. Examples of potential barrier materials where deposition in an oxidizing environment is preferred include ruthenium, magnesium, magnesium oxide, iron, cobalt, and nickel.

What is needed, therefore, is a process for allowing deposition on copper in an oxidizing environment.

SUMMARY

The present invention protects copper surfaces from oxidation when exposed to various types of oxidizing environments. Importantly, the invention allows IC fabrication processes to employ oxidizing environments when treating substrates having exposed copper lines or other features. Thus, for example, the invention permits use of oxygen species in chemical vapor deposition to form diffusion barrier layers on partially fabricated integrated circuits having exposed copper lines, such as those deposited in damascene processes.

The invention achieves this by passivating an exposed copper surface with a metallocene compound in order to minimize the formation of copper oxide on the exposed copper surface when contacting an oxygen-containing environment. The exposed copper surface may undergo treatment with the metallocene compound and exposure to the oxygen-containing environment in the same chamber, or multiple chambers may be used. ICs, for the purposes of this invention, include semiconductor devices used in processors, memory, displays, etc.

In one embodiment of the invention, a metallocene such as ruthenocene is used to passivate an exposed copper surface on a partially fabricated IC before depositing a layer of material on the surface. The passivation step is followed by a deposition step with an oxygen-containing chemistry.

The oxygen-containing environment may be used to form different types of layers on the IC, including etch stop barriers and diffusion barriers.

Various metallocene compounds may be used, including those containing ruthenium, cobalt, nickel, and iron, among others, and any of a variety of cyclopentadienyl ligand ring substitutions.

These and other features and advantages of the invention will be described in detail below with reference to the associated drawings.

DETAILED DESCRIPTION OF A PREFERRED EMBODIMENT

Introduction and Overview

This invention employs metallocene compounds to protect exposed copper surfaces from the formation of copper oxide during processing or handling in oxygen-containing environments. Exposure to ruthenocene vapor, for example, has been found to have a passivating effect on the oxidation rate of copper. The use of ruthenocene prevents or drastically reduces the formation of copper oxide. While the exact mechanism for this phenomenon remains unclear, the passivation could be due to the adsorption of ruthenocene on the copper surface or the very presence of ruthenocene vapor in the chamber. The passivation effect is observed even after air exposure, which enables it to be used for protecting partially fabricated integrated circuits during transport between processing modules and during storage. In general, the present invention provides protective copper passivation in several technologically important areas in IC fabrication.

Ruthenocene is not the only metallocene that may be used. Any metallocene that protects exposed copper surfaces from oxidation may be used. Generally, metallocenes are of the form bis-(cyclopentadienyl)-metal, including various substituted cyclopentadienyl groups. Examples of the metal include ruthenium, iron, nickel, cobalt, magnesium, palladium, platinum, titanium, chromium, osmium, manganese and combinations thereof.

The cyclopentadienyl ligands of the metallocene compounds may include any number of substituents on one or more of the groups. These substituents are typically alkyl or alkene groups, whose number, size, and location may be chosen to affect the steric properties of the compound and/or its volatility. The substitution pattern may be symmetric or asymmetric. Also included are bent and half metallocene structures as are known in the art.

The method disclosed in this application discusses the use of ruthenocene as an exemplary material, but applies equally to other metallocene compounds that exhibit the passivation effect.

Process

Figure 1:
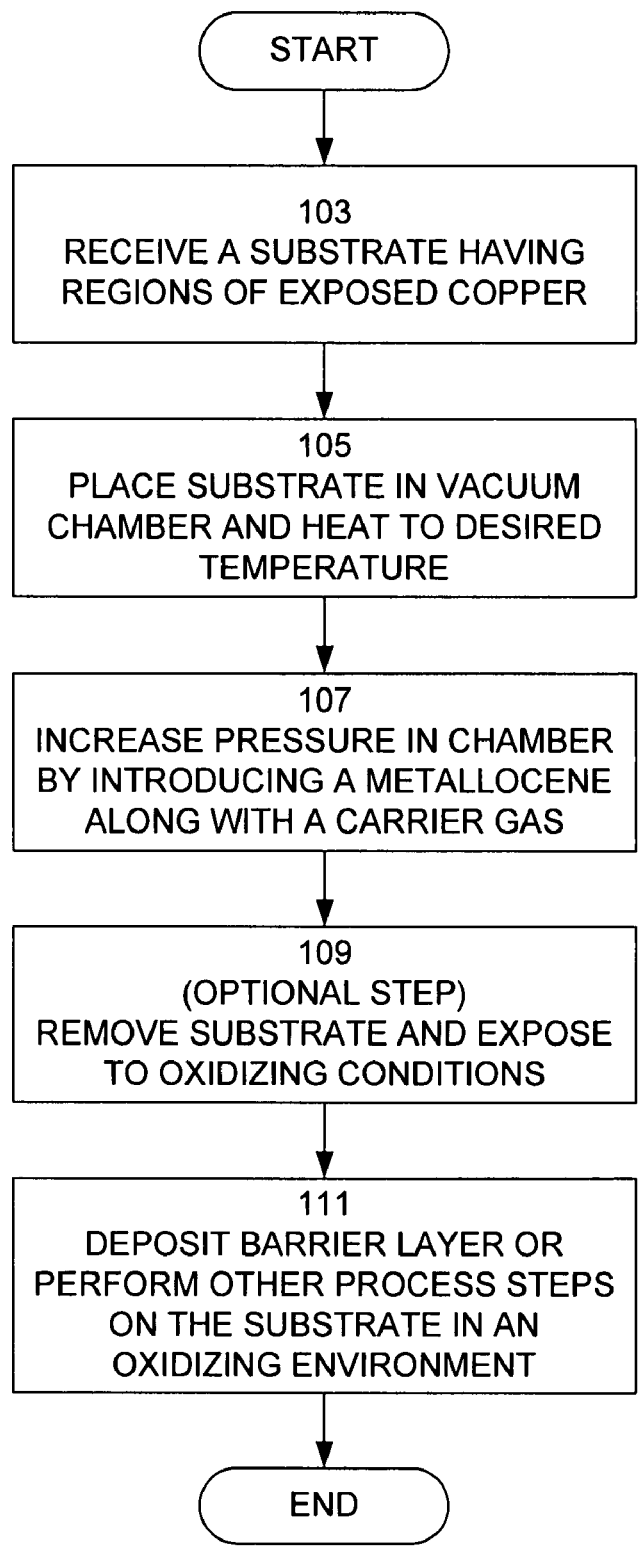
FIG. 1 is a process flow diagram depicting a process context of the present invention.

For context, one general process used to protect a substrate having regions of exposed copper metal is illustrated in FIG. 1. In operation 103, a substrate having regions of exposed copper metal is supplied. As indicated, the substrate can be any item having exposed copper surfaces. Typically, though not necessarily, these items are partially fabricated integrated circuits or other semiconductor devices. Examples of such devices include processors, memory, displays, etc. In many cases the copper serves as the conductor in current carrying lines in an integrated circuit. In current technology nodes, these lines are inlaid in trenches and vias cut in dielectric layers using a damascene fabrication flow. The lines and their dielectric templates are formed one layer on top of the next.

In operation 105, the substrate is prepared for passivation with a metallocene. In a typical embodiment, it is placed in a vacuum chamber and heated to the desired temperature of the metallocene passivation process. This temperature is generally in the range of about 20 to 420° C., more preferably between about 250 and 400° C. In operation 107, the metallocene is introduced to the chamber and allowed to passivate the exposed copper surfaces. In a typical approach, a pressure stabilization step is implemented in which the metallocene is permitted to fill a feed line to the chamber. Then the pressure is increased in the chamber by introducing the metallocene along with a carrier gas from the feed line. Of course, many other mechanisms are also suitable for introducing the metallocene to the chamber. As metallocenes may be liquids at room temperature, an ampoule or other source of metallocene may have to be heated to produce a sufficient partial pressure in the vapor phase. Alternatively, the metallocene may be introduced via a bubbler. The relevant passivation parameters include type of metallocene, substrate temperature, chamber pressure, and flux of metallocene to the substrate (a function of metallocene flow rate, exposure time, and substrate configuration). These parameters can be adjusted as appropriate to achieve the desired degree of passivation. In the case of ruthenocene, it is has been found that the adequate passivation can occur under the following range of conditions:

Pressure—about 0.1 to 10 Torr

Temperature—about 250 to 400° C.

Ruthenocene flow rate—about 0.1 to 100 sccm

After passivation has occurred, the substrate may be exposed to oxidizing environments. This includes ambient conditions encountered during storage and/or transport, for example. Thus, in an optional operation 109, the substrate is removed from the chamber and exposed to ambient conditions or other oxidizing environment. Operation 109 may take the form of moving the substrate between different chambers within a cluster tool.

After the substrate has been passivated in operation 107 and optionally exposed to oxidizing conditions in one context, the process continues with a fabrication operation in an oxidizing environment. Thus, as depicted in operation 111 for example, a barrier layer is deposited or some other process is performed on the substrate in an oxidizing environment. As used herein, an oxygen-containing environment is one containing oxygen or oxygenated species. These include elemental oxygen in the form of molecular oxygen or ozone, as well as other oxygen-containing compounds such as carbon dioxide, nitrous oxide, carbon monoxide, $NO_2$, $H_2O$ and the like. These species may exist in a gaseous state, a liquid state (as, for example, aerosols), or in a plasma. In the case of depositing a ruthenium barrier layer, for example, operation 111 may include exposing the substrate to ruthenocene (about 0.1 to 100 sccm), oxygen (about 10 to 1000 sccm), and a carrier gas such as argon (about 10 to 1000 sccm).

Note that in some embodiments, when the passivating agent is also a precursor for a deposition layer or other reactant, the passivation and fabrication process operations may be performed concurrently (e.g., operations 107 and 111 may be performed concurrently). To this end, a ruthenium barrier layer may be formed by simultaneously introducing ruthenocene, oxygen, and carrier gas. This may serve to reduce total process time.

Apparatus

The present invention can be implemented in many different types of apparatus. Generally, the apparatus will include one or more chambers or "reactors" (sometimes including multiple stations) that house one or more wafers and are suitable for wafer processing. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation). The various stations may be wholly or partially isolated by virtue of gas curtains, walls, etc. In such cases, the substrate may be indexed between different stations during a multistage process. In one example, a first station is used for passivating the substrate with a metallocene, a second chamber is employed for depositing a barrier layer on the passivated substrate, etc.

Figure 2:
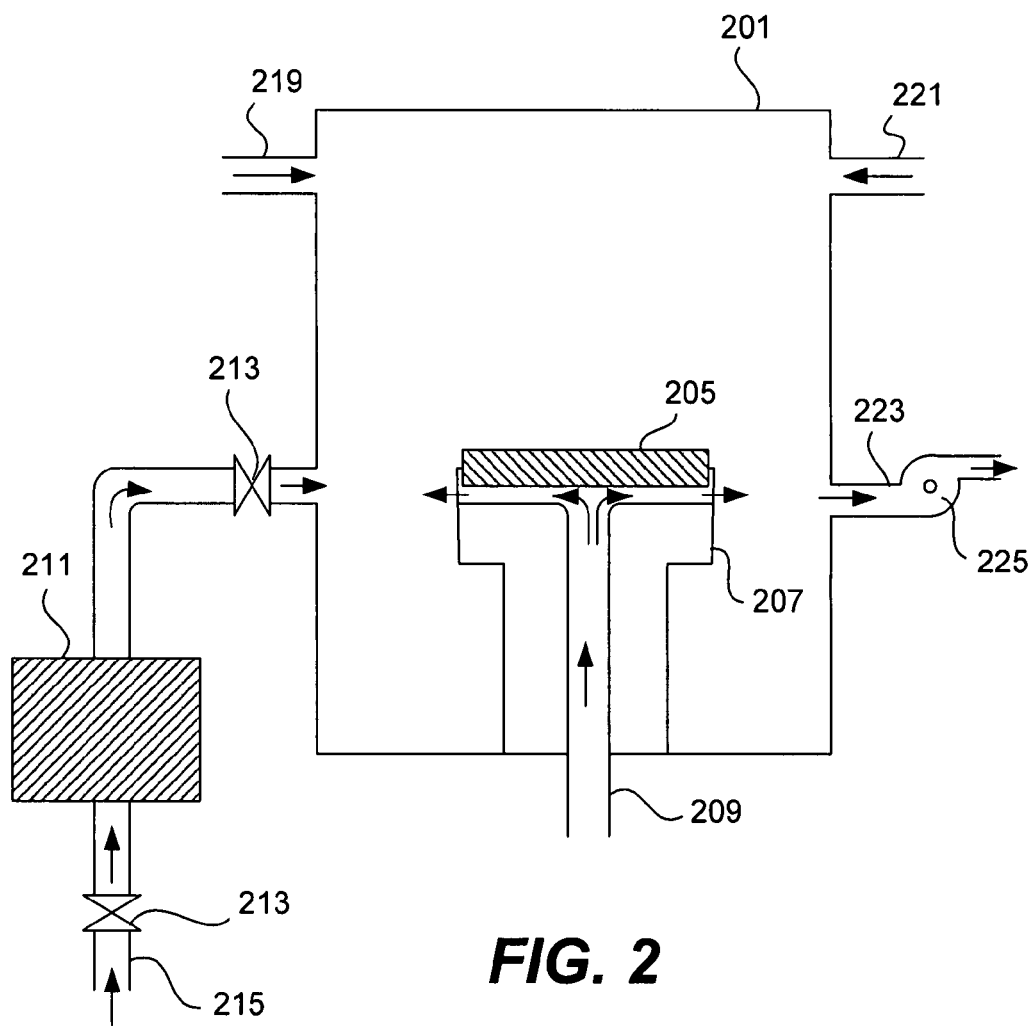
FIG. 2 is a block diagram depicting some of the components of a suitable apparatus for performing passivation in oxidation steps in accordance with this invention.

FIG. 2 provides a simple block diagram depicting various reactor components arranged as in a conventional reactor. As shown, a reactor 201 includes a process chamber 203, which encloses other components of the reactor. A substrate 205 is placed upon a temperature-controlled pedestal 207. A vacuum pump 225 is used to evacuate the air from process chamber 203 via vacuum line 223. The temperature of substrate 205 may be controlled by use of a "backside" gas line 209. The backside gas may be any inert gas heated or cooled to the desired temperature. A metallocene precursor is provided and allowed to sublimate into a carrier gas feed line 215. Isolation valves 213 are used to separate the metallocene vapor from the reactor and the carrier gas until the desired time. When the valves are open, a carrier gas forces the metallocene vapor into the chamber. The carrier gas may be any inert gas, such as argon. A diluent gas may be supplied through carrier line 219. The diluent gas may be any inert gas such as argon, nitrogen (depending on the process), helium, etc. An oxidizing gas, such as molecular oxygen ($O_2$), is supplied through line 221.

Applications

The present invention has many applications, four of which are described below. It will be understood by those skilled in the art that these examples are not intended to limit the scope of the invention and that numerous other applications are possible.

A primary application for this invention is to deposit diffusion barrier layers. As indicated above, many of these barrier layers would require an oxidizing environment to affect deposition. Before this invention, it was not commercially feasible to deposit barrier layers in an oxidizing environment. In a standard damascene process flow, a diffusion barrier is used to line exposed dielectric material in order to protect against diffusion of copper into the dielectric. While many different barrier materials are effective for this purpose, only the few that can be deposited in a non-oxidizing environment have actually been used. Barrier materials that require oxidizing conditions may now be used in IC fabrication processes, for example ruthenium, magnesium, magnesium oxide, iron, cobalt, and nickel. Note that different metals may be used in the passivation agent and the diffusion barrier. As an example, ruthenocene may be used as a passivation agent for the deposition of a cobalt barrier layer.

In many cases, the barrier layer is deposited from a chemical precursor in a chemical vapor deposition (CVD) reaction. The precursor is typically provided in a vapor or liquid phase and may be exposed to plasma conditions as in plasma enhanced CVD or PECVD. The deposition reaction may also have a sputtering or PVD component in which a metal target is sputtered to provide a metal source that reacts with other components in the reaction chamber to form the barrier layer. Various hybrid PVD-CVD processes are possible. Some of these will form multilayer diffusion barriers: e.g., a barrier layer comprised of a metal layer and a metal oxide layer. In all cases, the deposition substrate has exposed copper metal regions that are passivated using a metallocene in accordance with this invention. The thickness of a barrier layer produced is a function of the current technology node and the hence the line width of the copper lines. In most applications of current interest, the minimum copper line widths are no greater than about 0.2 µm and the barrier thickness is not greater than 100 Å.

Another application of the present invention involves depositing certain etch stop layers that could replace silicon nitride. Examples include aluminum oxide and magnesium oxide, both of which are deposited in oxidizing environments. Again, the substrate on which these materials is deposited will have metallocene-passivated copper regions. These materials are typically deposited using a CVD process, although numerous variations are possible.

Another class of applications for the present invention involves protecting copper surfaces from oxidation during handling, storage or transport of the substrate. One example of such application is to passivate PVD deposited copper seed layers prior to electroplating bulk copper. Commonly, a wafer with the seed layer deposited is exposed to the ambient (sometimes being stored for a period of hours) before being transported to an electroplating cell where bulk copper deposition takes place. Using ruthenocene or other metallocene passivating agents can protect the exposed seed layer from oxidation during this storage or transfer period. Given that copper seed layers are often quite thin and delicate, this protection can be particularly valuable.

A fourth application involves protecting an exposed copper surface immediately after or prior to etching. Many etch chemistries involve the use of oxygen. One example of an etch process in modern IC fabrication is the "barrier open" or via formation in a damascene process. In one approach, the exposed copper surface on a lower metallization layer is initially passivated with ruthenocene or other metallocene prior to deposition of the dielectric that is subsequently etched. In a specific example, the copper surface is passivated after chemical mechanical polishing but before a silicon nitride etch stop and dielectric layer have been deposited. In another approach, passivation material is deposited on newly exposed copper after etching to allow one to avoid a pre-cleaning operation prior to the next barrier deposition step. Pre-cleaning is typically accomplished using fairly aggressive plasma conditions. While pre-cleaning removes copper oxide, it can have detrimental effects such as faceting dielectric at the tops of vias or other openings in a dielectric layer. Thus, any process that eliminates or reduces the need for pre-cleaning is desirable.

As indicated, the passivation may be employed to either protect against an oxidizing environment during a process step or to protect exposed copper during exposure to the ambient or other oxidizing environment in between process steps. In the latter case, passivation gives the partially fabricated device improved shelf life.

EXPERIMENTAL EXAMPLES

In one experimental example, wafers deposited with copper using physical vapor deposition (PVD) were placed in a reaction chamber where they were passivated with ruthenocene. The wafers were exposed to different types of ruthenocene passivation and oxidation conditions. Each wafer was then examined to determine the thickness of its copper oxide layer and thereby allow comparison of the various conditions. To accomplish the passivation, the ruthenocene precursor was sublimated in a vacuum in order to prime a feedline with ruthenocene before the passivation operation actually began. During the actual passivation step, argon was used as a carrier gas (at 100 sccm) to push the ruthenocene from the feedline into the reaction chamber while bypassing a bubbler. Initially, the concentration of ruthenocene in argon was such that the ruthenocene was delivered at about 10 sccm. Over the course of delivery from the feedline this flow rate may have diminished. The passivation step was performed in the reactor at a pressure of 0.5 Torr. Depending on the experiment, the wafer was heated to a temperature of either 360° C. or 270° C. by delivering heated argon at 20 sccm to the heated pedestal. A diluent gas, in this case $N_2$, was separately supplied to the chamber at 100 sccm.

An oxidation step followed, in which 200 sccm of $O_2$ were supplied at 130 mTorr. In most cases, the passivation and oxidation steps took place in a single reactor, a custom-built vacuum chamber (CVD1) equipped with a heated pedestal, controlled gas flows and a throttle valve capable of maintaining constant pressure. Typically passivation, oxidation and CVD can be performed on substrates up to 200 mm in diameter in this chamber. In one variation of the experiment, the substrate was transferred to an oxidation test stand (Test Stand 1) before the oxidation process was performed. The oxidation test stand consists of a vacuum-pumped chamber with a heated pedestal, a pressure control device (throttle valve) and gas flow control system for oxygen and inert gases. The test stand is equipped with an in-situ spectroscopic reflectometer which allows the observation of the surface reflectivity of the Cu film during oxidation. The oxidation was conducted by first loading the wafer into the vacuum-chamber via a load-lock. Then, the wafer was placed on the heated pedestal and the oxidation commenced, in all experiments oxygen was used as the oxidation source. The passivation time varied from 0 to 90 seconds and the oxidation time varied from 0 to 300 seconds. Typically, the passivation and oxidation steps were sequential, with passivation occurring before oxidation. However, passivation and oxidation were in some cases performed simultaneously. The thickness of the copper oxide formed during the oxidation step was measured by taking reflectivity readings. In experiments where passivation and oxidation occurred in the same chamber, reflectivity measurements were made after the oxidation procedure ex situ using a Filmetrics spectroscopic reflectometer ($\lambda$=440 nm). When a wafer was treated in the oxidation test stand, reflectivity measurements were made both ex situ with the Filmetrics reflectometer and in situ with an Ocean Optics visible light spectroscopic reflectometer ($\lambda$=436 nm).

Table 1, shown below, presents sample results from variations of the above-discussed experiment. Eight experiments, labeled A-H, are shown.

steps occurred simultaneously. In experiment F, the 30 second combined passivation/oxidation step resulted in a 1.5 nm oxide layer. In experiment G the time was reduced to 20 seconds, producing a 0.7 nm layer.

Finally, in experiment H, a 30 second passivation step was performed without a subsequent oxidation step, leading to a 0.7 nm thick oxidation layer.

As indicated, in experiments A-D, where oxidation occurred on the oxidation test stand, real-time measurements of reflectivity were made in situ using the Ocean Optics visible light spectrometer ($\lambda$=436 nm.) The results of these readings can be seen in FIG. 3, which is a graph of copper oxidation layer thickness as a function of time for experiments A and B.

Figure 3:
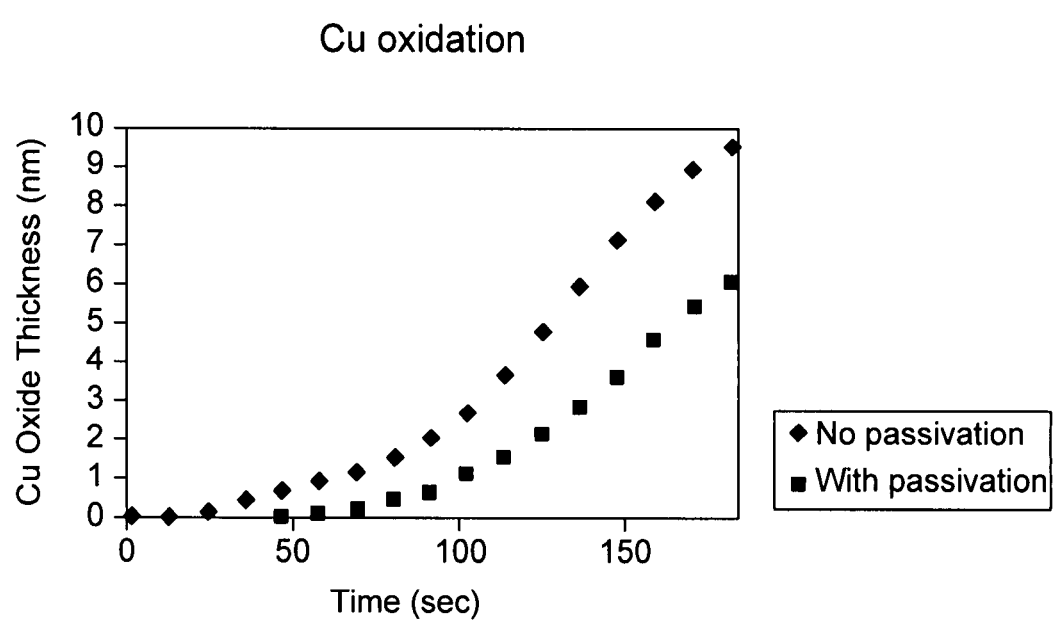
FIG. 3 is a graph showing oxide thickness as a function of oxidation exposure time for various passivated and unpassivated copper samples.

FIG. 3 is a graph showing the thickness of a copper oxide layer with respect to time for both a passivated and unpassivated surface (experiments A and B, respectively.) It is notable that the graph shows that the passivated surface does not show appreciable copper oxide formation in approximately the first 50 seconds after exposure to an oxidizing environment and that, for any given time the passivated surface always has a thinner oxide layer.

From the preceding data one can see that ruthenocene has a definite passivation effect on copper oxidation. In every case where a passivation step was performed, the copper

| Wafer Id | Wafer Temp (° C.) | Passivation time (sec) | Oxidation time (sec) | Oxidation Module | Mode | Duration between Passivation & Oxidation | Oxide in-situ (nm) | Oxide ex-situ (nm) |
|---|---|---|---|---|---|---|---|---|
| A | 360 | 0 | 300 | Test Stand 1 | n/a | n/a | 33 | 36 |
| B | 360 | 90 | 300 | Test Stand 1 | Sequential | same day | 9 | 8.5 |
| C | 360 | 90 | 30 | Test Stand 1 | Sequential | same day | 0.5 | 1 |
| D | 270 | 90 | 300 | Test Stand 1 | Sequential | same day | 6 | 5 |
| E | 360 | 90 | 30 | CVD1 | Sequential | same day | n/m | 3 |
| F | 360 | 30 | 30 | CVD1 | Simultaneous | n/a | n/m | 1.5 |
| G | 360 | 20 | 20 | CVD1 | Simultaneous | n/a | n/m | 0.7 |
| H | 360 | 30 | 0 | CVD1 | n/a | n/a | n/m | 0.7 |

The results of the oxidation experiments demonstrate that ruthenocene is an effective passivation agent. In experiment A, a wafer without ruthenocene passivation was oxidized in the oxidation test stand at 360° C. The final oxide thickness readings after 300 seconds were 36 nm (ex situ) and 33 nm (in situ). In experiment B, a 90 second passivation step occurred in the reaction chamber prior to transferring the wafer to the oxidation test stand for oxidation. This experiment produced an 8.5 nm thick oxide layer ex situ (and 9 nm in situ) under the same oxidizing conditions as in experiment A. In experiment C, the oxidation time was reduced to 30 seconds, with a resulting final oxide thickness of 1 nm ex situ (0.5 in situ). The wafer temperature was reduced to 270° C. in experiment D, while the oxidation time was raised back up to 300 seconds, producing an oxide layer 5 nm thick ex situ (6 nm in situ).

In experiments E-G, both the passivation and the oxidation steps were performed in the RuCVD chamber. Hence, all thickness/reflectivity measurements were made in situ. In experiment E, a 90 second passivation step was followed by a 30 second oxidation step, resulting in a 3 nm thick oxide layer. In experiments F and G, the passivation and oxidation oxide film thickness was significantly thinner than in the base case (experiment A), where no passivation treatment step was performed. Even in experiments F and G, where passivation was performed simultaneously with oxidation, the thickness of the oxidation layer was comparable to the other experiments. Also, as can be seen in experiment D, a lower process temperature reduced the thickness of the oxide layer.

Other Embodiments

While this invention has been described in terms of certain embodiments, there are various alterations, modifications, permutations, and substitute equivalents, which fall within the scope of this invention. It should also be noted that there are many alternative ways of implementing the methods and apparatuses of the present invention. Further, there are numerous applications of the present invention, both inside and outside the integrated circuit fabrication arena. It is therefore intended that the following appended claims be interpreted as including all such alterations, modifications, permutations, and substitute equivalents as fall within the true spirit and scope of the present invention.

What is claimed is:

1. A method of protecting an exposed copper surface of a partially fabricated IC from oxidation during exposure to an oxygen-containing environment, the method comprising:

passivating the exposed copper surface by contacting the exposed copper surface with a metallocene compound and no other reactants; and after passivating the exposed copper surface, contacting the exposed copper surface with the oxygen-containing environment, whereby exposure to the metallocene compound reduces formation of copper oxide on the exposed copper surface; wherein the metallocene compound contains a metal bound to one or more cyclopentadienyl ligands.

2. The method of claim 1, wherein the metallocene contains a metal selected from the group consisting of ruthenium, cobalt, nickel, iron, palladium, platinum, titanium, chromium, osmium, and manganese.

3. The method of claim 1, wherein the metallocene is ruthenocene.

4. The method of claim 1, wherein contacting the exposed copper surface with a metallocene compound comprises flowing a gas containing metallocene over the partially fabricated IC.

5. The method of claim 1, wherein contacting the exposed copper surface with the oxygen-containing environment comprises contacting the exposed copper surface with a compound that forms a solid phase layer on the partially fabricated IC.

6. The method of claim 5, wherein the compound is a precursor compound that reacts with an oxygen-containing species to form the solid phase layer.

7. The method of claim 1, wherein contacting the exposed copper surface with the oxygen-containing environment comprises contacting the exposed copper surface with a diffusion barrier precursor, which reacts with an oxygen-containing species to form a barrier layer on the partially fabricated IC.

8. The method of claim 7, wherein the oxygen-containing species is molecular oxygen.

9. The method of claim 1, wherein contacting the exposed copper surface with the oxygen-containing environment comprises contacting the exposed copper surface with an etch stop precursor, which reacts with an oxygen-containing species to form an etch stop layer on the partially fabricated IC.

10. The method of claim 1, wherein contacting the exposed copper surface with the oxygen-containing environment comprises contacting the exposed copper with the ambient or other oxygen-containing environment during storage or transport between processing modules.

11. The method of claim 1, wherein the exposed copper surface comprises a copper seed layer on the partially fabricated IC.

12. A method of passivating and using an exposed copper surface of a partially fabricated IC, the method comprising:

passivating the exposed copper surface by contacting the exposed copper surface with a metallocene compound and no other reactants, wherein the metallocene compound contains a metal bound to one or more cyclopentadienyl ligands; and after passivating the surface, depositing a layer of material on the exposed copper surface using an oxygen-containing deposition chemistry.

13. The method of claim 12 further comprising performing the contacting and depositing step in a single chamber.

14. The method of claim 12 wherein the depositing is conducted using the metallocene compound as a chemical precursor to the material.

15. The method of claim 12 wherein the contacting and depositing operations are done concurrently.

16. The method of claim 12, wherein the metallocene is contains a metal selected from the group consisting of ruthenium, cobalt, nickel, iron, palladium, platinum, titanium, chromium, osmium, and manganese.

17. The method of claim 12, wherein the metallocene is ruthenocene.

18. The method of claim 12, wherein contacting the exposed copper surface with a metallocene compound comprises flowing a gas containing metallocene over the partially fabricated IC.

19. The method of claim 12, wherein the depositing of a layer of material comprises contacting the exposed copper surface with a compound that forms a solid phase layer on the partially fabricated IC.

20. The method of claim 12, wherein the depositing of a layer of material comprises contacting the exposed copper surface with a diffusion barrier precursor, which reacts with an oxygen-containing species to form a barrier layer on the partially fabricated IC.

21. The method of claim 20, wherein the oxygen-containing species is molecular oxygen.

22. The method of claim 12, wherein depositing a layer of material comprises contacting the exposed copper surface with an etch stop precursor, which reacts with an oxygen-containing species to form an etch stop layer on the partially fabricated IC.

23. The method of claim 12, wherein the exposed copper surface comprises a copper seed layer on the partially fabricated IC.

* * * * *